(12) United States Patent
Ochiai et al.

(10) Patent No.: US 7,604,152 B2
(45) Date of Patent: Oct. 20, 2009

(54) METHOD FOR MANUFACTURING A PRINTED CIRCUIT BOARD FOR ELECTRONIC DEVICES AND AN ELECTRONIC DEVICE USING THE SAME

(75) Inventors: Masayuki Ochiai, Kawasaki (JP); Hiroki Uchida, Kawasaki (JP); Toshiya Akamatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 241 days.

(21) Appl. No.: 11/340,620

(22) Filed: Jan. 27, 2006

(65) Prior Publication Data

US 2007/0090171 A1 Apr. 26, 2007

(30) Foreign Application Priority Data

Oct. 25, 2005 (JP) ............................... 2005-310202

(51) Int. Cl.
*H05K 3/00* (2006.01)
(52) U.S. Cl. .............. 228/111.5; 228/180.1; 228/262.1; 228/225; 438/612; 257/777; 257/778
(58) Field of Classification Search .............. 228/111.5, 228/180.1, 262.1, 225; 438/612; 257/777, 257/778
See application file for complete search history.

(56) References Cited

U.S. PATENT DOCUMENTS

| 5,569,433 | A | * | 10/1996 | Chen et al. .................. 420/557 |
| 5,740,730 | A | * | 4/1998 | Thompson, Sr. ............. 101/127 |
| 6,604,282 | B2 | * | 8/2003 | Kotaki ......................... 29/843 |
| 2002/0013010 | A1 | * | 1/2002 | Maruyama et al. ............. 438/18 |
| 2003/0089923 | A1 | * | 5/2003 | Oida et al. .................... 257/200 |
| 2003/0173587 | A1 | * | 9/2003 | Amagai et al. ............... 257/200 |
| 2004/0065718 | A1 | * | 4/2004 | Kubokawa et al. ........ 228/180.1 |

FOREIGN PATENT DOCUMENTS

| JP | 2001259884 A | * | 9/2001 |
| JP | 2002-1573 | | 1/2002 |
| JP | 3347512 | | 9/2002 |

* cited by examiner

*Primary Examiner*—Jessica L Ward
*Assistant Examiner*—Erin B Saad
(74) *Attorney, Agent, or Firm*—Fujitsu Patent Center (57) ABSTRACT

A soldering technology, particularly a lead-free soldering technology, that can secure the reliability of a whole electronic device is provided. In a method for manufacturing a printed circuit board for electronic devices with a substrate to which a plurality of electronic parts having connection terminals with different metal compositions are connected by soldering, a plurality of solder pastes comprising solder components with different compositions are used, and when the electronic parts are connected by soldering to the substrate, a solder paste having a solder component with a different composition is used for each of the metal compositions for the connection terminals of the electronic parts.

18 Claims, 4 Drawing Sheets

METHOD FOR MANUFACTURING A PRINTED CIRCUIT BOARD FOR ELECTRONIC DEVICES AND AN ELECTRONIC DEVICE USING THE SAME

CROSS-REFERENCE TO RELATED APPLICATIONS

This application is based upon and claims the benefit of priority from the prior Japanese Patent Application No. 2005-310202, filed on Oct. 25, 2005, the entire contents of which are incorporated herein by reference.

BACKGROUND OF THE INVENTION

1. Field of the Invention

The present invention relates to a new method for manufacturing a printed circuit board for electronic devices and an electronic device for which the printed circuit board is used.

2. Description of the Related Art

The surface mounting technology is known as a method for manufacturing a printed circuit board for electronic devices. In the surface mounting technology, electronic parts can be mounted densely, and therefore, it provides a merit of realizing miniaturization and weight-reduction of electronic devices.

According to a printed circuit board manufacturing (assembling) process by the surface mounting technology, a solder paste is first printed through a metal mask on a printed circuit board which is an object to which electronic parts are connected by soldering (in the present invention, a printed circuit board which is an object to which electronic parts are connected by soldering is referred to as "a substrate"), the electronic parts are mounted on the printed solder paste, and then, the parts are connected to the substrate by heating to a temperature not less than the melting point of the solder component.

A solder paste is a creamy material composed of a mixture of a solder component and a flux for paste. When heated to a temperature not less than the melting point of the solder component, the solder component which is usually in the shape of a powder is melted to be a unified form and forms a solder connection part. A metal mask is a metal plate having through openings corresponding to positions of electrodes on the substrate. By using the metal mask, it is possible to supply and apply a solder paste to the substrate electrodes.

Conventionally, lead (Pb) has been used for the solder paste. However, in view of the consideration on the environmental pollution, the need for a lead-free solder has become stronger in recent years. For example, in EU, the RoHS Directive will be enforced as of July, 2006. Accordingly, use of lead (Pb) will be prohibited in the general electronic devices, making application of a lead-free solder an indispensable element in assembling of printed circuit boards.

As a lead-free solder, a Sn-3Ag-0.5Cu solder (melting point 218° C.) is being developed for application to various products. However, since it has a melting point that is 35° C. higher than the conventional Sn-37Pb solder (melting point 183° C.), there is a problem that, if there is an electronic part with a low heat resistance, application to a product with the part is not possible due to the thermal damage incurred to the part.

A Sn-57Bi-1Ag solder (melting point 138° C.) is another system which is a low melting point, lead-free, Sn-58Bi solder (melting point 139° C.) with 1 wt. % of Ag added. By the addition of Ag, the fatigue life is greatly improved due to its finer metal structure. It is known that when the amount of Ag to be added exceeds 1 wt. %, the fatigue life is shortened due to crystallization of coarse crystals of $Ag_3Sn$, an intermetallic compound (Japanese Patent No. 3347512 (paragraph [0012]).

However, the application of a Sn-57Bi-1Ag solder has been limited until now. The reason is that there are some conventional electronic parts that have connection terminals with Sn-10Pb plating, and they cannot provide secure connection reliability to the solder connection parts due to a Bi—Pb—Sn alloy with a melting point not more than 100° C. generated at the solder connection parts during the connection by soldering.

Regarding electronic parts for the surface mounting technology, there is an LSI package called BGA (Ball Grid Array)/CSP (Chip Scale Package) having solder balls at the bottom surfaces of the electronic part bodies. The material for the solder balls has a composition of Sn-3Ag-0.5Cu. In this case, when a Sn-57Bi-1Ag composition is used for a solder paste, for example, the Ag concentration exceeds 1 wt. % at the solder connection parts, caused by the transfer of Ag in the Sn-3Ag-0.5Cu composition during the connection by soldering, leading to a shorter fatigue life.

On the other hand, when a QFP (Quad Flat-leaded Package) part having connection terminals without Ag in their metal composition is mounted with a Sn-58Bi solder paste, a high connection reliability cannot be realized since no Ag is included in the solder connection parts.

Thus, when assembling of a printed circuit board is carried out only with either one of the Sn-58Bi solder paste and Sn-57Bi-1Ag solder paste, there will be solder connection parts partly generated with decreased connection reliability, resulting in decrease in reliability of the whole device.

SUMMARY OF THE INVENTION

Accordingly, it is an object of the present invention to provide a soldering technology that secures the reliability of a whole electronic device, particularly a lead-free soldering technology that secures the reliability of a whole electronic device. The other objects and advantages of the present invention will be clarified in the following descriptions.

According to one aspect of the present invention, provided is a method for manufacturing a printed circuit board for electronic devices with a substrate to which a plurality of electronic parts having connection terminals with different metal compositions are connected by soldering, wherein: a plurality of solder pastes comprising solder components with different compositions are used; and when said electronic parts are connected by soldering to said substrate, a solder paste having a solder component with a different composition is used for each of the metal compositions for the connection terminals of electronic parts.

By this aspect of the present invention, a method for manufacturing a printed circuit board for electronic parts is realized that can secure the reliability of a whole electronic part.

Preferable are that the manufactured printed circuit board is a lead-free printed circuit board; that the plurality of solder pastes comprising solder components with different compositions, comprise a solder paste having a Sn—Bi solder component without Ag, and a solder paste having a Sn—Bi—Ag solder component; that, when Ag is present at the connection terminals of an electronic part to be connected by soldering, the solder paste comprising a Sn—Bi solder component without Ag is applied to the substrate electrodes corresponding to the connection terminals, and when Ag is absent at the connection terminals of an electronic part to be connected by soldering, the solder paste comprising a Sn—Bi—Ag solder component is applied to the substrate electrodes corresponding to the connection terminals; that the Sn—Bi solder component without Ag has a composition of Sn-58Bi, and the Sn—Bi—Ag solder component has a composition of Sn-57Bi-1Ag; that, in the case in which Ag is present at the connection terminals of an electronic part to be connected by soldering, the connection terminals have a metal composition of Sn-3Ag-0.5Cu, and in the case in which Ag is absent at the connection terminals of an electronic part to be connected by soldering, the connection terminals have a metal composition of Sn-3Bi; that Ag is present in a range of 0.1 to 1.0 wt. % in the Sn—Bi—Ag solder component; that the method comprises, after applying a plurality of solder pastes comprising solder components with different compositions to the substrate, mounting electronic parts on the substrate, and then, subjecting the substrate to a thermal treatment; that the method comprises, after a first solder paste is applied to the substrate, subjecting the substrate to a thermal treatment, then, applying a second solder pastes to the substrate, followed by mounting of electronic parts on the substrate, and then subjecting the substrate to a thermal treatment; that the method comprises applying a solder paste 1 to the substrate, applying a solder paste 2 to the connection terminals of an electronic part, mounting, on the substrate, an electronic part to be connected by soldering with the solder paste 1 and the electronic part to which the solder paste 2 is applied, and then, subjecting the substrate to a thermal treatment; that the method comprises carrying out solder paste application to the substrate using a different metal mask for each of the solder pastes comprising solder components with different compositions, when the electronic parts are connected by soldering to the substrate; and that the method comprises using a metal mask having a recessed part on the substrate-contacting surface thereof that does not pass through the metal mask.

According to another aspect of the present invention, an electronic device is provided for which a printed circuit board is used that is manufactured by any one of the above-described methods for manufacturing a printed circuit board. By this aspect of the present invention, an electronic device with a reliability secured for the whole device is obtained.

By the present invention, it is possible to obtain a soldering technology that secures the reliability of a whole electronic device, particularly a lead-free soldering technology that secures the reliability of a whole electronic device. To be more specific, it is possible to solve the problem of decrease of reliability in a whole electronic device that is caused by solder connection parts with a decreased connection reliability partly generated during the manufacture of a printed circuit board for the electronic device.

DESCRIPTION OF THE PREFERRED EMBODIMENTS

Below, embodiments of the present invention are explained using drawings, examples, etc. These drawings, examples, etc. as well as the explanations themselves, merely illustrate the present invention, and do not limit the scope of the present invention. Of course other aspects which do not deviate from the gist of the present invention also fall within the scope of the present invention. In the figures, the same numeral represents the same element.

The following aspects of the present invention are mostly explained about solder pastes containing two sets of solder components with different compositions. However, the present invention can be applied to solder pastes containing three sets or more solder components with different compositions. Furthermore, combination of any of the embodiments of the present invention together and combination of any of the embodiments of the present invention with a method other than those are applicable, as long as they do not deviate from the gist of the present invention.

First, the problems of the conventional technology will be explained, using FIG. 4. Although a case in which a BGA part having ball joint terminals 7*a* is used as an electronic part 7, and a QFP part is used as an electronic part 8, is assumed commonly in the following explanations, it goes without saying that the present invention is applicable to other electronic parts.

Figure 4:
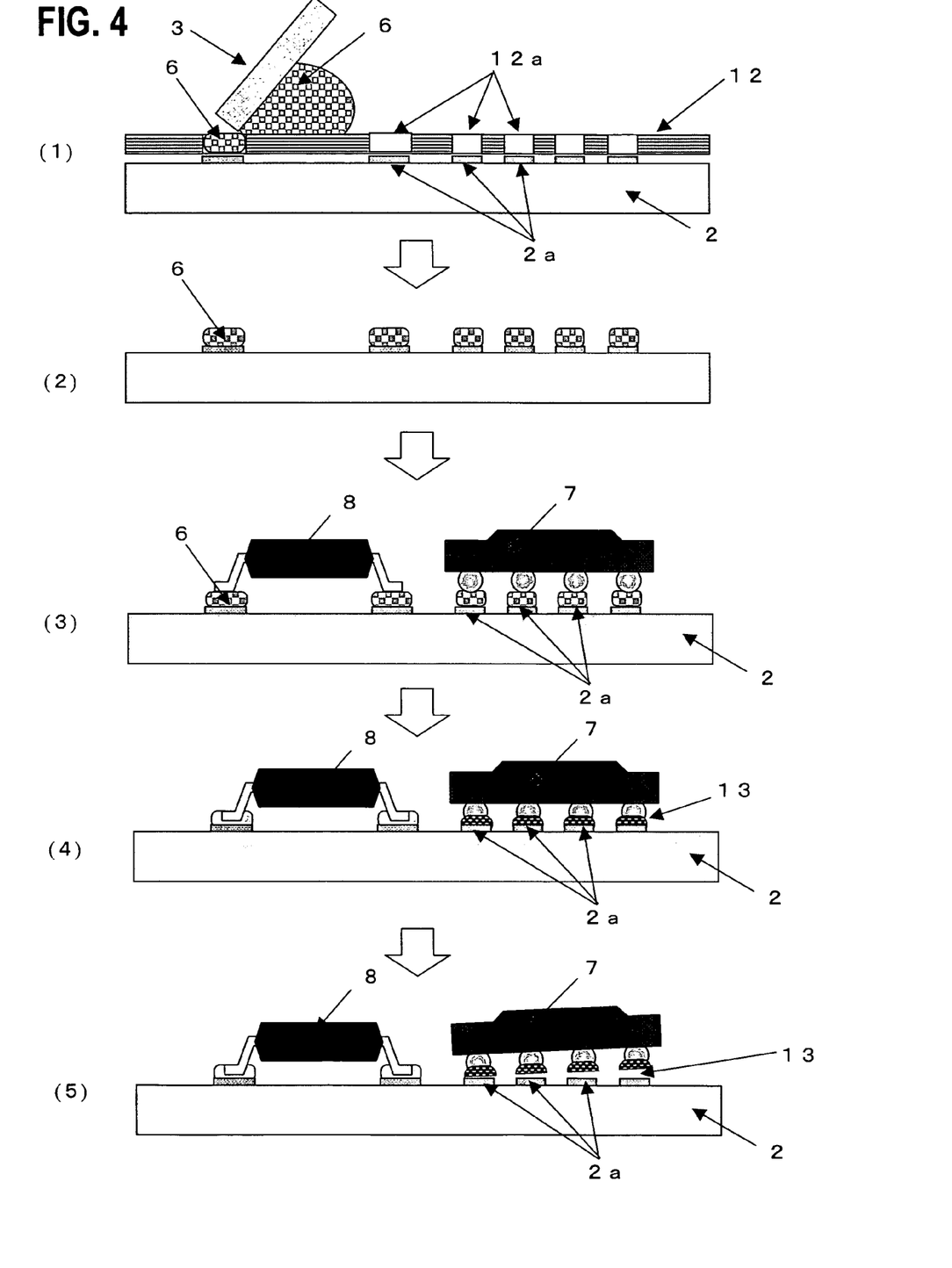
FIG. 4 is a schematic view showing a manufacturing process of a printed circuit board for explaining a conventional technology.

In one example of the conventional technology, a metal mask 12 is placed at an appropriate position on a substrate 2 with substrate electrodes 2*a*, and a solder paste 6 is printed through openings 12*a* of the metal mask, using a squeegee 3 for printing, as shown in FIG. 4(1). By this, the solder paste 6 is applied to all the substrate electrodes that require connection by soldering, as shown in FIG. 4 (2).

Then, the electronic parts 7,8 are mounted onto the solder paste as shown in FIG. 4 (3), followed by a thermal treatment to complete the connection by soldering, as shown in FIG. 4 (4).

In this way, there would partly occur solder connection parts with a decreased connection reliability that will incur defects including line breakage 13 or the like, as shown in FIG. 4(5). It is considered that this is caused by a solder composition generated which will decrease the connection reliability, as described above.

In contrast, in one aspect of the present invention, in a method for manufacturing a printed circuit board for electronic devices with a substrate to which a plurality of electronic parts having connection terminals with different metal compositions are connected by soldering, a plurality of solder pastes comprising solder components with different compositions are used; and when these electronic parts are connected by soldering to the substrate, a solder paste having a solder component with a different composition is used for each of the metal compositions for the connection terminals of electronic parts.

There is no particular limitation to the material and shape of the substrate, and it may be appropriately selected from among known materials for substrates.

There is no particular limitation to the electronic parts to be connected, and they can be appropriately selected from known electronic parts. It is to be noted that the "metal compositions for the connection terminals" in the present invention refers to the compositions of metals present on the surfaces of connection terminals which are connected by soldering. Although plating is often formed on the connection terminals of electronic parts to facilitate soldering in general, the metal composition of the plating corresponds, in this case, to the metal composition for the connection terminals.

A solder paste according to the present invention is composed of a solder component and a flux for paste, and is generally a creamy material. There is no particular limitation to the flux for paste, and it can be appropriately selected from known materials.

"A solder paste having a solder component with a different composition is used for each of the metal compositions for the connection terminals of electronic parts to be connected" means, for example, that, when there are two types of electronic parts to be connected that have connection terminals with different metal compositions, a solder paste comprising a solder component with a different composition is used for each type of the electronic parts having the connection terminals with different metal compositions.

For example, a solder paste comprising a Sn—Bi solder component without Ag which is used as a solder paste comprising a solder component with a different composition, can be combined for use with a solder paste comprising a Sn—Bi—Ag solder component. It is to be noted here that, sometimes, any other metal component may also be present in the Sn—Bi solder component without Ag and/or the Sn—Bi—Ag solder component, as long as it is within the gist of the present invention.

When there are three types of different metal compositions for connection terminals, the above description means that a solder paste comprising a solder component with a different composition is used for each type of the electronic parts having the connection terminals with different metal compositions, in a similar way.

In this way, the metal compositions in the solders of the solder connection parts can be easily optimized, and the problem of solder connection parts partly generated with decreased connection reliability, resulting in decrease in reliability of the whole electronic device such as occurred in a printed circuit board manufactured, using a solder paste containing one the same solder composition without exception, can be solved. That is, it is possible to secure the reliability of a whole electronic device. This aspect of the present invention is particularly preferably applied to cases in which lead-free printed circuit boards are manufactured, making it possible to supply lead-free printed circuit board products which are in compliance with the RoHS Directive.

For example, when Ag is contained in the metal composition for the connection terminals of an electronic part, a solder paste comprising a Sn—Bi solder component without Ag is supplied and applied to the corresponding substrate electrodes, and otherwise, that is, when Ag is not contained in the metal composition for the connection terminals of an electronic part, a solder paste comprising a Sn—Bi—Ag solder component is supplied and applied to the corresponding substrate electrodes. By assembling printed circuit boards in this way, favorable Ag compositions are obtained in all the solder connection parts, and a high connection reliability is provided.

A preferable example of a composition for a Sn—Bi solder component without Ag is Sn-58Bi, and a preferable example of a composition for a Sn—Bi—Ag solder component is Sn-57Bi-1Ag.

When Ag is present on the connection terminal of electronic parts to be connected by soldering, Sn-3Ag-0.5Cu is a preferable example of the metal composition for the connection terminals. When Ag is absent on the connection terminals of electronic parts to be connected by soldering, Sn-3Bi is a preferable example of the metal composition for the connection terminals.

In addition, there is no particular limitation to the concrete method for the "application" in the present application, and it can be appropriately selected from known methods. Combination of a metal mask and printing is a common procedure. For this reason, "printing" is often used for description instead of application in this specification. However, the present invention should not be construed narrowly, based on such explanations.

Also, a solder component according to the present invention is composed of a plurality of metals, and usually takes a form of an alloy having a single composition. However, the composition may be non-uniform, may contain a single metal, or may contain a mixture of metals, as long as a desired alloy composition is obtained by a thermal treatment and it does not deviate from the gist of the present invention. It is to be noted that the melting point of a solder component when it is not composed only of an alloy having a single composition as a whole may be defined as a temperature when the whole components turn into a liquid.

It is preferable that Ag is contained in a range of 0.1-1.0 wt. % in the above-described Sn—Bi—Ag solder component. When the Ag is less than 0.1 wt. %, increase in fatigue life due to finer metal structure is hard to be expected. When the Ag exceeds 1.0 wt. %, decrease in fatigue life tends to occur due to crystallization of coarse crystals.

As a method for manufacturing a printed circuit board according to the above-described conditions, a method is specifically exemplified that, after applying a plurality of solder pastes comprising solder components with different compositions to the substrate, electronic parts are mounted on the substrate, and then, the substrate is subjected to a thermal treatment. In this way, heating may be performed only once, which avoids complex processings.

In this case, it goes without saying that a temperature should be used in the thermal treatment, the temperature being not less than the highest among the melting points of the solder components of the plurality of solder pastes to be used.

In the above description, the "electronic parts" do not necessarily mean all the electronic parts used for the substrate. They may be part of them. Also, "after applying a plurality of solder pastes comprising solder components with different compositions to the substrate" may be after applying to the substrate all the "plurality of solder pastes comprising solder components with different compositions" to be applied to the substrate, or after applying to the substrate part of the "plurality of solder pastes comprising solder components with different compositions". For example, when there are not fewer than three sets of "plurality of solder pastes comprising solder components with different compositions" according to the present invention, and not fewer than three types of "electronic parts" according to the present invention, a case is also included in the category of the above-described aspect in which two sets of "solder pastes comprising solder components with different compositions" and two types of "electronic parts" satisfy the above-described conditions among the solder pastes and the electronic parts.

When electronic parts and solder pastes which do not fall under the above-described conditions are used together, the relationship between the application of the pastes and the thermal treatments can be determined arbitrarily for those electronic parts and solder pastes which do not fall under the above-described conditions. For example, a case combined with a method of "after applying a first solder paste to the substrate, the substrate is thermally treated, and then, after applying a second solder paste to the substrate, the electronic parts are mounted on the substrate, followed by the thermal treatment of the substrate" which will be described later, corresponds to this case.

In the method for manufacturing a printed circuit board according to the present invention, it is preferable to comprise carrying out the application to the substrate, using a different metal mask for each solder paste comprising a solder component with a different composition, when electronic parts are connected by soldering to the substrate. In this way, it is possible to easily apply a plurality of solder pastes comprising solder components with different compositions to a substrate.

It is to be noted that, when, after applying a solder paste using a metal mask, a different metal mask is used for applying a solder paste to different substrate electrodes, it is necessary to have the corresponding parts of the metal mask in a state where the paste does not pass through the metal mask (a state where there is no through hole for the application), in order to avoid the application to the substrate electrodes to which a solder paste has already been applied. However, the metal mask cannot be placed properly sometimes because the solder paste that has been applied beforehand collides with the metal mask. In such a case, it is preferable to use a metal mask having a recessed part on the substrate-contacting surface thereof that does not pass through the metal mask.

Using FIG. 3, an explanation will be made as follows on a case in which, when electronic parts are connected to a substrate by soldering, a different metal mask is used for each of two sets of solder pastes with different compositions in order to print the two sets of solder pastes onto the substrate, wherein a metal mask having a recessed part on the substrate-contacting surface thereof that does not pass through the metal mask is used as a second metal mask.

It is to be noted that, in the following explanation in common, the solder pastes 4 and 6 are the solder pastes comprising solder components with compositions which are different from each other, constituting the "plurality of solder pastes comprising solder components with different compositions" according to the present invention.

Figure 3:
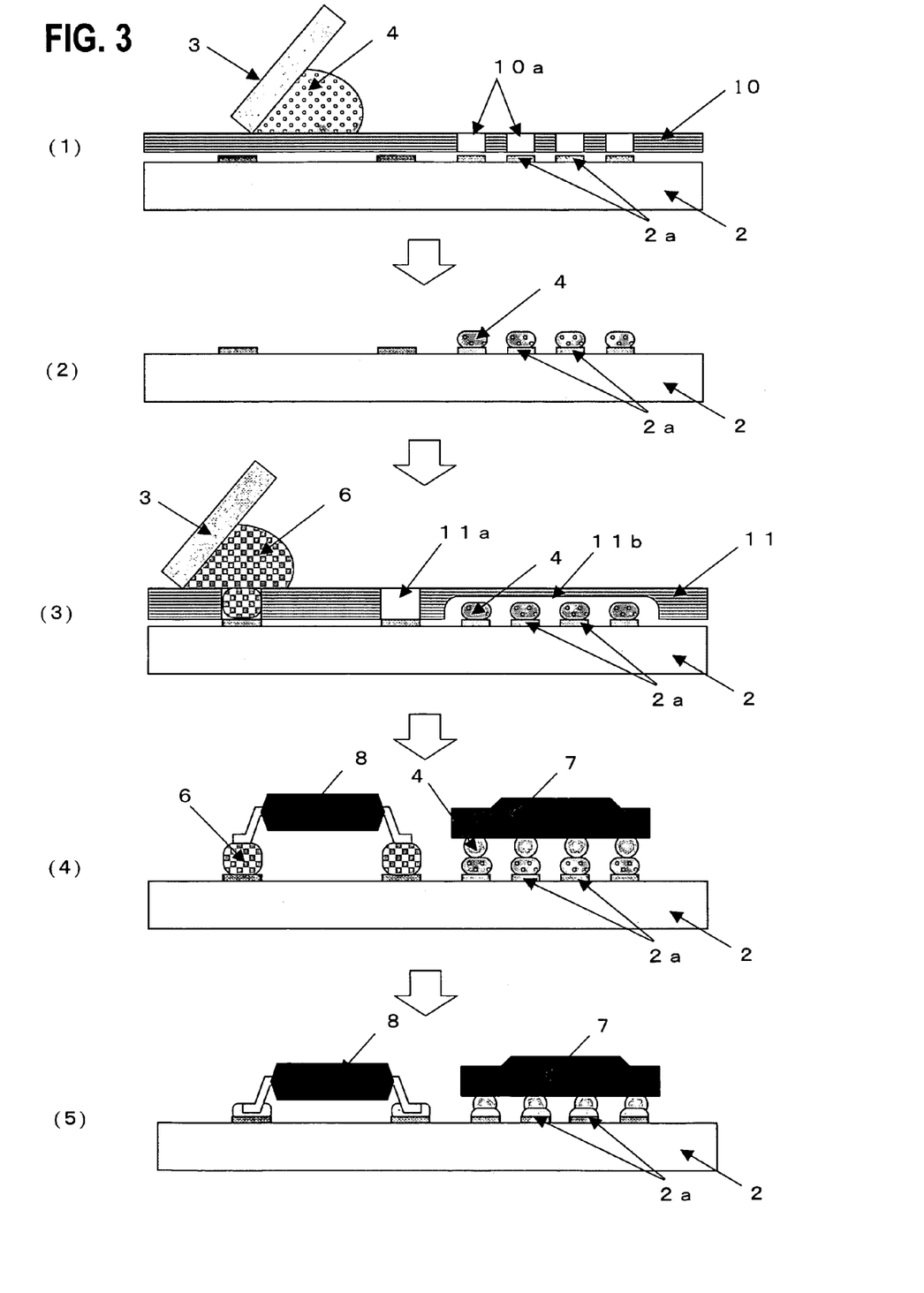
FIG. 3 is still another schematic view showing a manufacturing process of a printed circuit board for explaining one embodiment of the present invention.

First, with reference to FIG. 3 (1), a metal mask 10 is placed at an appropriate position on a substrate 2 having substrate electrodes 2a, the solder paste 4 is printed through the through openings 10a of the metal mask, using a squeegee 3 for printing. In this case, parts of the metal mask corresponding to parts of the substrate electrodes {the left-side substrate electrodes in FIG. 3(1)}, are designed for the solder paste not to pass the metal mask. By this, the solder paste 4 is applied to some limited parts of the substrate electrodes, as shown in FIG. 3(2).

In this state, the height of a substrate electrode and the height of a substrate electrode+solder paste are widely different from each other, as is understood by the comparison of the states of the substrate electrodes on the left and right in FIG. 3(2). Accordingly, if a simple plate-shaped metal mask is used for the next printing, the height of a substrate electrode+solder paste will sometimes obstruct the placement of the metal mask.

In such a case, it is possible to use, as the second meal mask, a metal mask having a recessed part 11b on the substrate-contacting surface thereof that does not pass through the metal mask as shown in FIG. 3(3). That is, according to FIG. 3(3), a metal mask 11 having a recessed part 11b that does not pass through the metal mask is placed at an appropriate position on the substrate 2 having substrate electrodes 2a, and the solder paste 6 is printed through the through openings 11a of the metal mask, using a squeegee 3 for printing.

Then, the electronic parts 7, 8 are mounted on the solder paste as shown in FIG. 3(4), followed by a thermal treatment to complete the connection by soldering as shown in FIG. 3(5).

It is also an aspect of the present invention, and is preferable that a solder paste applied onto substrate electrodes is heated to a temperature not less than the melting point of the solder component so as to melt the powdery solder component into a unified form and then, a usual plate-shaped metal mask without a recessed part on the substrate-contacting surface thereof that does not pass through the metal mask is used, instead of employing a metal mask having a recessed part on the substrate-contacting surface thereof that does not pass through the metal mask. That is, after a first solder paste is applied to the substrate, the substrate is subjected to a thermal treatment, and then, after a second solder paste is applied to the substrate, electronic parts are mounted on the substrate, and then, the substrate is subjected to a thermal treatment. It is to be noted that, when three types or more of solder pastes comprising solder components with different compositions are used, and if any two of the solder pastes satisfy the conditions for the above-described first and second solder pastes, the conditions for the use of the other solder pastes can be determined arbitrarily.

This procedure will be explained using FIG. 2. First, according to FIG. 2(1), a metal mask 5 is placed at an appropriate position on a substrate 2 with substrate electrodes 2a, and the solder paste 4 is printed through openings 5a of the metal mask, using a squeegee 3 for printing. In this case, parts of the metal mask corresponding to parts of the substrate electrodes {the left-side substrate electrodes in FIG. 2(1)} are no openings in a state in which the solder paste does not pass through the metal mask. In this way, the solder paste 4 is applied to some limited parts of the substrate electrodes as shown in FIG. 2(2).

Figure 2:
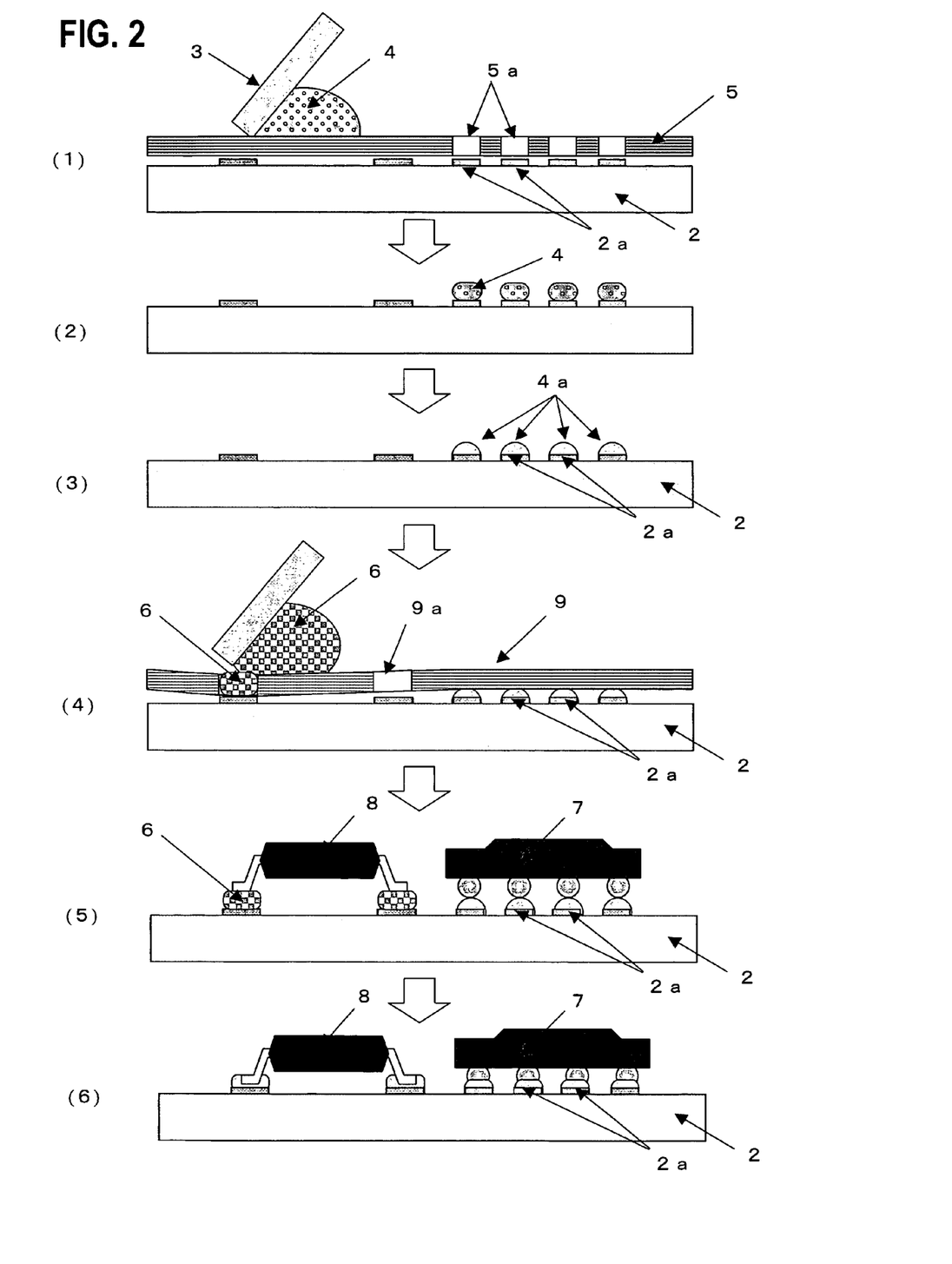
FIG. 2 is another schematic view showing a manufacturing process of a printed circuit board for explaining one embodiment of the present invention.

In this state, by subjecting the substrate to a thermal treatment so as to melt and solidify the solder paste to form a presolder bump 4a, it is possible to reduce the height of the solder paste (the height of the presolder bump 4a to be exact) as shown in FIG. 2(3).

In this way, even a simple plate-shaped metal mask may be placed appropriately as the second metal mask as shown in FIG. 2(4) in many cases. Accordingly, by employing this method, it becomes unnecessary to use a metal mask having a recessed part on the substrate-contacting surface thereof that does not pass through the metal mask. Then, the solder paste 6 is printed on the substrate through a metal mask 9 with through openings 9a formed.

Then, the electronic parts 7, 8 are mounted on the solder pastes as shown in FIG. 2(5), followed by a thermal treatment to complete the connection by soldering as shown in FIG. 2(6)

In stead of using two metal masks, a method is also an aspect of the present invention, and is preferable, the method comprising applying a solder paste 1 onto the substrate, applying a solder paste 2 onto the connection terminals of electronic parts, mounting electronic parts to be connected by soldering with the solder paste 1 and the electronic parts with solder paste 2 applied, on the substrate, and then, subjecting the substrate to a thermal treatment. In particular, the "applying a solder paste onto the connection terminals of electronic parts" method is preferably applied to BGA parts having ball joint terminals. Even if the amount of supply of the solder paste to the ball joint terminals of BGA parts fluctuates to some extent, the influence hardly shows up, since the amount of solder on the ball joint terminals is relatively large (about seven times as large) compared with one for the QFP parts. In this way, influence on the connection reliability can be minimized.

It is to be noted that, when three types or more solder pastes comprising solder components with different compositions are used, and if any two of the solder pastes satisfy the conditions for the above-described solder pastes 1 and 2, the conditions for use of the other solder pastes can be determined arbitrarily.

This procedure will be explained using FIG. 1. First, according to FIG. 1(1), a metal mask 1 is placed at an appropriate position on a substrate 2 with substrate electrodes 2a, and the solder paste 6 is printed through openings 1a of the metal mask, using a squeegee 3 for printing. In this case, parts of the metal mask corresponding to parts of the substrate electrodes {the right-side substrate electrodes in FIG. 1(1)} are no openings in a state in which the solder paste does not pass the metal mask. In this way, the solder paste 6 is applied to some limited parts of the substrate electrodes as shown in FIG. 1(2).

Figure 1:
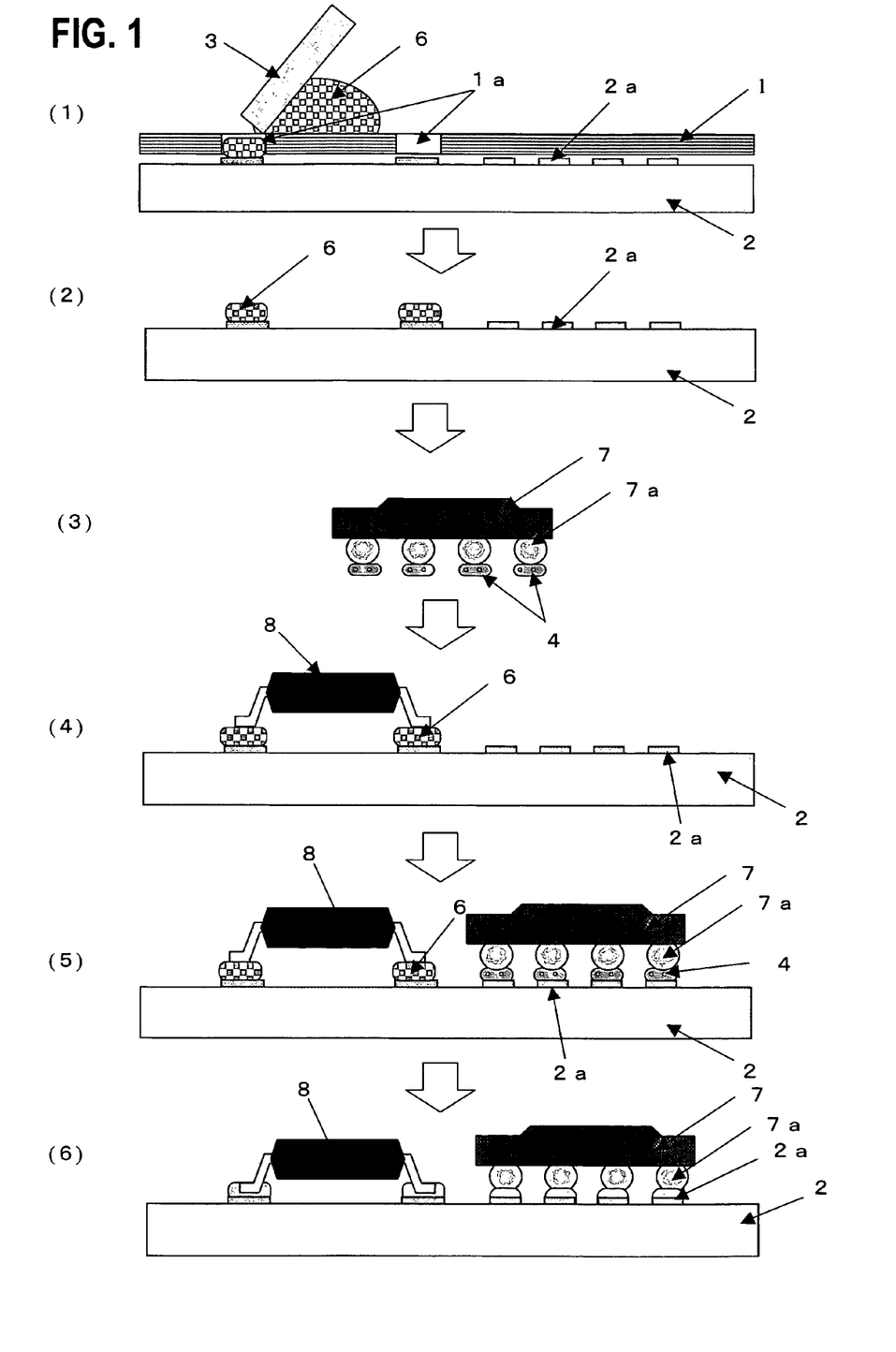
FIG. 1 is a schematic view showing a manufacturing process of a printed circuit board for explaining one embodiment of the present invention.

Then, the solder paste 4 is applied by the transfer method or the like to the connection terminals of the electronic parts 7, as shown in FIG. 1(3). Separately, the electronic parts 8 are mounted on the solder paste 6 as shown in FIG. 1(4). The steps in FIGS. 1(1), (2), and (4) and the step in FIG. 1(3) may be carried out independently from each other.

Then, after the electronic parts with the solder paste applied are mounted on the appropriate substrate electrodes as shown in FIG. 1(5), the substrate is subjected to a thermal treatment so as to complete the connection by soldering as shown in FIG. 1(6).

By employing the above-described various aspects, the problem of occurrence of solder connection parts generated partly with a decreased connection reliability can be prevented and the reliability can be enhanced even in the case of lead-free printed circuit boards.

Therefore, use of such printed circuit boards will be able to realize highly reliable electronic devices, particularly highly reliable lead-free electronic devices. There is no particular limitation to the electronic devices, and any known electronic device may be used. As examples, enumerated are electronic devices processing audio information, textual information, image information, etc., and to be more specific, computers, television sets, cellular phones, etc.

EXAMPLES

Next, EXAMPLES and a COMPARATIVE EXAMPLE of the present invention will be described. The test conditions are as follows.

In the following, a Sn-57Bi-1Ag solder paste was used as the solder paste 6, and a Sn-58Bi solder paste was used as the solder paste 4. However, they do not limit the scope of the present invention.

The Sn-57Bi-1Ag solder paste 6 corresponds to the solder paste comprising a Sn—Bi—Ag solder component according to the present invention, and the Sn-58Bi solder paste 4 corresponds to the solder paste comprising a Sn—Bi solder component without Ag according to the present invention.

(Thermal Cycle Test)

Electric conductance was checked at the solder connection parts at every fiftieth test cycle while each test cycle was carried out at a temperature condition from −65° C. to 125° C. for a cycle time of 60 minutes. The checking was carried out up to 500th cycle.

Example 1

The steps shown in FIG. 1 were employed. The Sn-57Bi-1Ag solder paste 6 was printed on the substrate 2 through a metal mask 1 (0.15 mm thick) with through openings 1a formed corresponding to a 208-pin QFP part, and the QFP part 8 (208 pins) having lead connection terminals with Sn-3Bi plating was mounted on the solder paste.

Then, the Sn-58Bi solder paste 4 was supplied by the transfer method to be applied to the ball connection terminals of the BGA part (352 pins) 7 having ball connection terminals with a metal composition of Sn-3Ag-0.5Cu, the BGA part was mounted on specified substrate electrodes 2a, and the substrate was heated at 180° C. for the solder connection.

When the thermal cycle test under the temperature condition of −65° C. to 125° C. was carried out for the prepared printed circuit board samples, all the solder connection parts showed connection reliability values that corresponded to 10-year use.

Example 2

The steps shown in FIG. 2 were employed. The Sn-58Bi solder paste 4 was printed on the substrate 2 through a metal mask 5 (0.15 mm thick) with through openings 5a formed corresponding to a 352-pin BGA part. Then, the substrate was heated at 180° C. to form a presolder bump 4a on the substrate electrodes. Afterwards, the Sn-57Bi-1Ag solder paste 6 was printed on the substrate through a metal mask 9 (0.15 mm thick) with through openings 9a formed corresponding to a 208-pin QFP part.

Then, the BGA part (352 pins) 7 having ball connection terminals with a metal composition of Sn-3Ag-0.5Cu was mounted on the substrate electrodes on which the presolder bump 4a was placed, the QFP part (208 pins) 8 having lead connection terminals with Sn-3Bi plating was mounted on the electrodes on which the Sn-57Bi-1Ag solder paste 6 was printed, and then, the substrate was heated at 180° C. for the solder connection. A rosin-type liquid flux was applied to the Sn—Bi presolder bump 4a on the substrate before the mounting of the BGA part.

When the thermal cycle test under the temperature condition of −65° C. to 125° C. was carried out for the prepared printed circuit board samples, all the solder connection parts showed connection reliability values that corresponded to 10-year use.

Example 3

The steps shown in FIG. 3 were employed. The Sn-58Bi solder paste 4 was printed on the substrate 2 through a metal mask 10 (0.15 mm thick) with through openings 10a formed corresponding to a 352-pin BGA part. Then, the Sn-57Bi-1Ag solder paste 6 was printed on the substrate through a metal mask 11 (0.15 mm thick) with through openings 11a corresponding to a 208-pin QFP part, and with recessed parts 11b that did not pass through the metal mask formed by half etching on the locations corresponding to the Sn-58Bi paste-printed parts.

Then, the BGA part (352 pins) 7 having ball connection terminals with a metal composition of Sn-3Ag-0.5Cu was mounted on the electrodes on which the Sn-58Bi solder paste 4 had been printed, the QFP part (208 pins) 8 having lead connection terminals with Sn-3Bi plating was mounted on the electrodes on which the Sn-57Bi-1Ag solder paste 6 was printed, and the substrate was heated at 180° C. for the solder connection.

When the thermal cycle test under the temperature condition of −65° C. to 125° C. was carried out for the prepared printed circuit board samples, all the solder connection parts showed connection reliability values that corresponded to 10-year use.

Comparative Example 1

The steps shown in FIG. 4 were employed. The Sn-57Bi-1Ag solder paste 6 was printed on the substrate through a metal mask 12 (0.15 mm thick) with through openings 12a formed corresponding to a 352-pin BGA part and a 208-pin QFP part.

Then, the BGA part (352 pins) 7 having ball connection terminals with a metal composition of Sn-3Ag-0.5Cu and the QFP part (208 pins) 8 having lead connection terminals with Sn-3Bi plating were mounted, and the substrate was heated at 180° C. for the solder connection.

When the thermal cycle test under the temperature condition of −65° C. to 125° C. was carried out for the prepared printed circuit board samples, the 352-pin BGA part gave a connection reliability value that corresponded to only 5-year use.

It is considered that this result was caused by the fact that, at the solder connection parts of the BGA part, the Sn—Ag—Cu balls of the BGA part contacted the Sn—Bi—Ag solder which had turned into a liquid phase to dissolve it partly, and as a result, the Ag concentration of the solder connection parts exceeded 1 wt. % to a large extent.

What is claimed is:

1. An electronic device for which a printed circuit board is used that is manufactured by a method for manufacturing a lead-free printed circuit board for electronic devices with a substrate to which a plurality of electronic parts having connection terminals with different metal compositions are connected by soldering, wherein:

a plurality of solder pastes comprising solder components with different compositions are used;

said plurality of solder pastes comprising solder components with different compositions comprise a solder paste having a Sn—Bi solder component without Ag, and a solder paste having a Sn—Bi—Ag solder component;

when said electronic parts are connected by soldering to said substrate, a solder paste having a solder component with a different composition is used for each of the metal compositions for the connection terminals of electronic parts;

when Ag is present at connection terminals of an electronic part to be connected by soldering, said solder paste having a Sn—Bi solder component without Ag is applied only to the substrate electrodes corresponding to the connection terminals with Ag thereat, and when Ag is absent at connection terminals of an electronic part to be connected by soldering, said solder paste having a Sn—Bi—Ag solder component is applied only to the substrate electrodes corresponding to the connection terminals without Ag thereat; and wherein, in said case in which Ag is present at connection terminals of an electronic part to be connected by soldering, said connection terminals with Ag thereat have a metal composition of Sn-3Ag-0.5Cu, and in said case in which Ag is absent at connection terminals of an electronic part to be connected by soldering, said connection terminals without Ag thereat have a metal composition of Sn-3Bi.

2. A method for manufacturing a lead-free printed circuit board for electronic devices comprising:

applying a first solder paste having a Sn—Bi solder component without Ag onto a first plurality of electrodes formed on a printed circuit;

applying a second solder paste having a Sn—Bi—Ag solder component onto a second plurality of electrodes formed on the printed circuit;

applying a first group of electronic parts having a first group of connection terminals with a metal composition comprising Sn, Ag and Cu onto said first solder paste;

placing a second group of electronic parts having a second group of connection terminals with a metal composition comprising Sn and Bi and without Ag onto said second solder paste; and heating said first solder paste, second solder paste, first group of connection terminals, and second group of connection terminals.

3. A method for manufacturing a printed circuit board for electronic devices according to claim 2, wherein said metal composition comprising Sn, Ag, and Cu has a composition of Sn-3Ag-0.5Cu.

4. A method for manufacturing a printed circuit board for electronic devices according to claim 2, wherein said metal composition comprising Sn and Bi and without Ag has a composition of Sn-3Bi.

5. A method for manufacturing a printed circuit board for electronic devices according to claim 2, wherein said Sn—Bi—Ag solder component has a composition of Sn-57Ag-1Ag.

6. A method for manufacturing a printed circuit board for electronic devices according to claim 2, wherein said Sn—Bi solder component without Ag has a composition of Sn-58Bi.

7. A method for manufacturing a lead-free printed circuit board for electronic devices with a substrate to which a plurality of electronic parts having connection terminals with different metal compositions are connected by soldering, wherein:

a plurality of solder pastes comprising solder components with different compositions are used;

said plurality of solder pastes comprising solder components with different compositions comprise a solder paste having a Sn—Bi solder component without Ag, and a solder paste having a Sn—Bi—Ag solder component;

when said electronic parts are connected by soldering to said substrate, a solder paste having a solder component with a different composition is used for each of the metal compositions for the connection terminals of electronic parts;

when Ag is present at connection terminals of an electronic part to be connected by soldering, said solder paste having a Sn—Bi solder component without Ag is applied only to the substrate electrodes corresponding to the connection terminals with Ag thereat, and when Ag is absent at connection terminals of an electronic part to be connected by soldering, said solder paste having a Sn—Bi—Ag solder component is applied only to the substrate electrodes corresponding to the connection terminals without Ag thereat; and wherein, in said case in which Ag is present at connection terminals of an electronic part to be connected by soldering, said connection terminals with Ag thereat have a metal composition of Sn-3Ag-0.5Cu, and in said case in which Ag is absent at connection terminals of an electronic part to be connected by soldering, said connection terminals without Ag thereat have a metal composition of Sn-3Bi.

8. A method for manufacturing a lead-free printed circuit board according to claim 7, wherein Ag is present in a range of 0.1 to 1.0 wt. % in said Sn—Bi—Ag solder component.

9. A method for manufacturing a lead-free printed circuit board according to claim 7, comprising, after applying a plurality of solder pastes comprising solder components with different compositions to said substrate, mounting electronic parts on said substrate, and then, subjecting said substrate to a thermal treatment.

10. A method for manufacturing a lead-free printed circuit board according to claim 7, comprising, after a first solder paste is applied to said substrate, subjecting said substrate without mounted electronic parts to a thermal treatment, then, applying a second solder pastes to said substrate, followed by mounting of electronic parts on said substrate, and then subjecting said substrate to a thermal treatment.

11. A method for manufacturing a lead-free printed circuit board according to claim 7, comprising:
applying a solder paste 1 to said substrate;
applying a solder paste 2 to the connection terminals of an electronic part;
mounting, on said substrate, an electronic part to be connected by soldering with the solder paste 1 and said electronic part to which the solder paste 2 is applied; and then,
subjecting said substrate to a thermal treatment.

12. A method for manufacturing a lead-free printed circuit board according to claim 7, comprising carrying out solder paste application to the substrate using a different metal mask for each of said solder pastes comprising solder components with different compositions, when said electronic parts are connected by soldering to said substrate.

13. A method for manufacturing a lead-free printed circuit board according to claim 7, comprising using a metal mask having a recessed part on the substrate-contacting surface thereof that does not pass through the metal mask.

14. An electronic device for which a printed circuit board is used that is manufactured by a method for manufacturing a lead-free printed circuit board according to claim 7.

15. A method for manufacturing a lead-free printed circuit board according to claim 7, wherein said Sn—Bi solder component without Ag has a composition of Sn-58Bi, and said Sn—Bi—Ag solder component has a composition of Sn-57Bi-1Ag.

16. An electronic device for which a printed circuit board is used that is manufactured by a method for manufacturing a lead-free printed circuit board according to claim 8.

17. An electronic device for which a printed circuit board is used that is manufactured by a method for manufacturing a lead-free printed circuit board according to claim 9.

18. An electronic device for which a printed circuit board is used that is manufactured by a method for manufacturing a lead-free printed circuit board according to claim 10.

* * * * *

UNITED STATES PATENT AND TRADEMARK OFFICE
CERTIFICATE OF CORRECTION

PATENT NO. : 7,604,152 B2  Page 1 of 1
APPLICATION NO. : 11/340620
DATED : October 20, 2009
INVENTOR(S) : Ochiai et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 344 days.

Signed and Sealed this

Fifth Day of October, 2010

David J. Kappos
*Director of the United States Patent and Trademark Office*